(12) United States Patent
Trine et al.

(10) Patent No.: US 8,391,012 B2
(45) Date of Patent: Mar. 5, 2013

(54) INTEGRATED HANDLE AND STACKING SYSTEM

(75) Inventors: Dennis Trine, Santa Fe Springs, CA (US); Lei Zhao, Arcadia, CA (US)

(73) Assignee: Champion Power Equipment, Santa Fe Springs, CA (US)

(*) Notice: Subject to any disclaimer, the term of this patent is extended or adjusted under 35 U.S.C. 154(b) by 415 days.

(21) Appl. No.: 12/754,778

(22) Filed: Apr. 6, 2010

(65) Prior Publication Data

US 2011/0242769 A1 Oct. 6, 2011

(51) Int. Cl.
*H05K 7/00* (2006.01)

(52) U.S. Cl. ............................................. 361/735

(58) Field of Classification Search .......... 361/735, 361/728; 174/50, 50.52, 51, 66, 92, 520
See application file for complete search history.

(56) References Cited

U.S. PATENT DOCUMENTS

| 7,432,606 B2 | 10/2008 | Yamamoto et al. | |
|---|---|---|---|
| 2002/0090844 A1* | 7/2002 | Kocin | 439/74 |
| 2008/0158785 A1* | 7/2008 | Murray et al. | 361/622 |

OTHER PUBLICATIONS

Reliance Parallel Cable Kit for Yamaha Generators (Yamaha parallel), Outdoor Gear Engine, 2008, p. 1 of 1.

* cited by examiner

*Primary Examiner* — Jeremy Norris
*Assistant Examiner* — Tremesha S Willis
(74) *Attorney, Agent, or Firm* — Stetina Brunda Garred & Brucker; James C. Yang

(57) ABSTRACT

An integrated handle and stacking system for an inverter generator is provided. Each of a plurality of inverter generators may have a handle disposed at a top side of the inverter generator. Additionally, a mount may be disposed at a bottom side of the inverter generator. The handles may have recesses sized and configured to receive the mounts of an upper inverter generator so that the plurality of inverter generators may be stacked upon each other. Accordingly, the handles provide a convenient means for carrying or transporting the inverter generator from point A to point B and the recesses/mounts provide a convenient means of stacking the plurality of inverter generators. The handles and/or mounts may have dampening material to isolate vibration between stacked inverter generators.

15 Claims, 5 Drawing Sheets

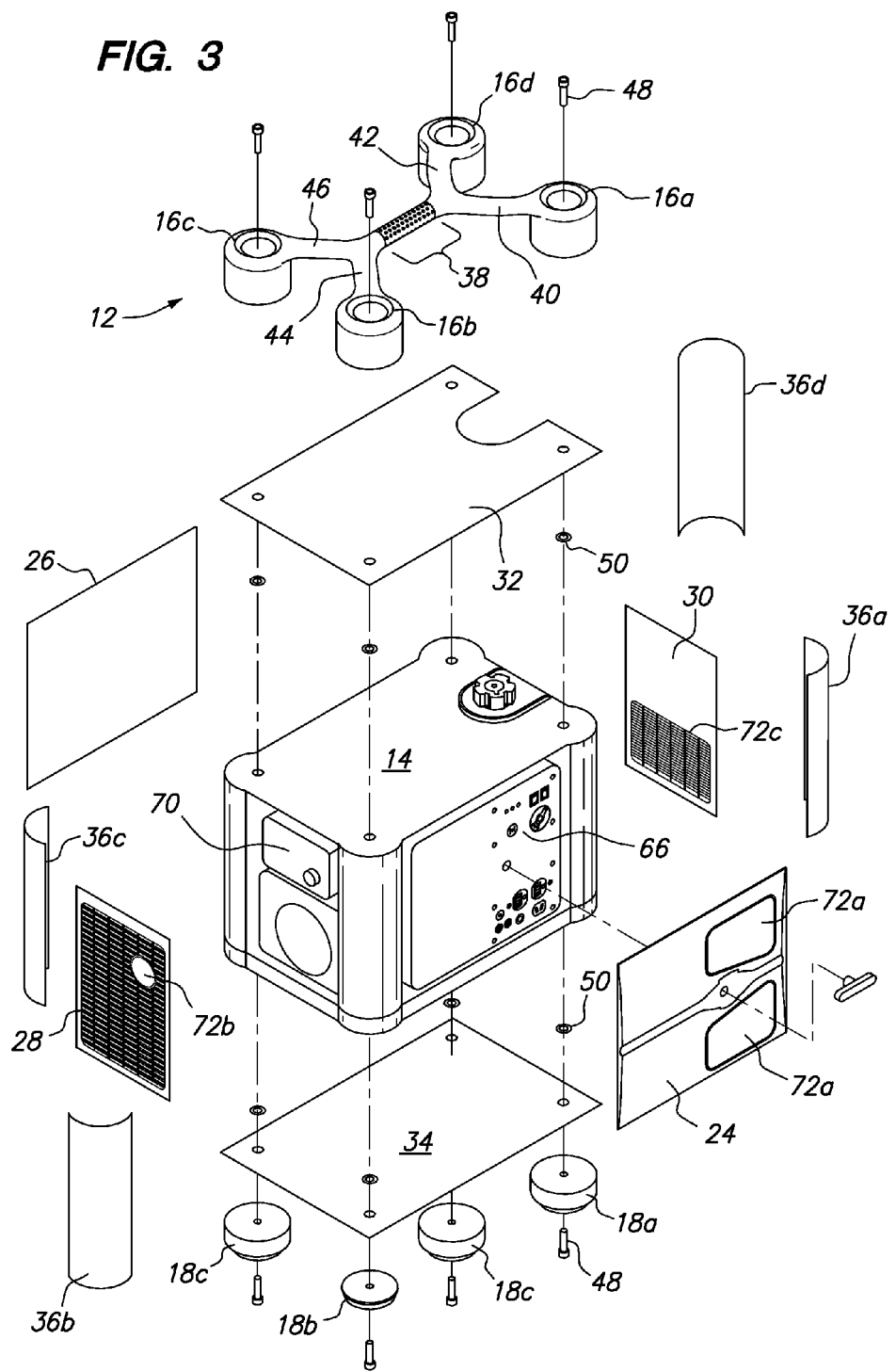

INTEGRATED HANDLE AND STACKING SYSTEM

CROSS-REFERENCE TO RELATED APPLICATIONS

Not Applicable

STATEMENT RE: FEDERALLY SPONSORED RESEARCH/DEVELOPMENT

Not Applicable

BACKGROUND

The integrated handle and stacking system relates to an inverter generator having a handle to carry the generator from point A to point B and complimentary recesses and mounts for stacking two or more inverter generators.

Inverter generators having an engine for driving a generator to generate electric power have long been known in the art. Some inverter generator designs include handles for carrying the inverter generator from point A to point B. Also, these inverter generators may have mounts for supporting the inverter generator on a level ground surface.

During setup that requires multiple inverter generators, the setup crew may transport multiple inverter generators to a location. Typically, the inverter generators are laid on the ground side by side. Adjacent inverter generators must have a sufficient gap between the two inverter generators so that the user may start the inverter generator by pulling a start chord. Additionally, adjacent inverter generators must be gapped apart to allow exhaust fumes to flow to the environment unimpeded and air intakes to receive fresh air.

As a result of the above setup of inverter generators, the multiple inverter generators may take up a significant amount of floor space. Also, it may be cumbersome to start each of the generators since an adjacent generator may be in the way while pulling the start cord of another generator. As such, there is a need in the art for a method and device to provide for reduced floor space requirements for multiple inverter generators.

BRIEF SUMMARY

The integrated handle and stacking system disclosed herein addresses the needs discussed above, discussed below and those that are known in the art.

In particular, the integrated handle and stacking system may comprise (1) a handle, (2) an object (e.g., engine generator, inverter generator, etc.) to be carried and stacked and (3) a mount. The handle may be disposed adjacent a top side of the object whereas the mounts may be disposed adjacent a bottom side of the object. To carry the object, the user grasps the handle to lift and transport the object from point A to point B. Conveniently, the user may also stack two or more of the objects upon each other. In particular, the handles may have recesses which are directed upward in the vertical direction. These recesses are sized and configured to receive the mount disposed at the bottom side of the object. The user may lift an object and place it on top of a lower object by aligning the mount of an upper object to a recess of a handle attached to a lower object. For stability purposes, at least three recesses are formed in the handle that receives three mounts of the upper object. Preferably, there are at least four recesses that receive four corresponding mounts of the upper object. The recesses and mounts may be spaced apart to provide as stable a platform as desired. Moreover, the mounts and handles may be fabricated from a dampening material such as rubber material, elastomeric material, plastic material, etc. to isolate vibration caused by an upper object (e.g., motor, engine, etc.) from the lower object, and vice versa.

The object may be a mechanical component, electrical component, an electromechanical component or some other object to be carried and stacked. Accordingly, the integrated handle and stacking system provides for a convenient means of carrying the object from point A to point B, stacking a plurality of objects upon each other, as well as isolating vibration between the objects when stacked.

More particularly, a stackable power equipment system is disclosed. The system may comprise upper and lower electrical modules stacked upon each other. The upper electrical module may include a first electrical component defining opposed top and bottom sides, a first handle for hand carrying the first electrical component and a first protrusion extending below the bottom side of the first electrical component. The first handle may be attached to the first electrical component and extend above the top side of the first electrical component. The first handle having a first recess. The first protrusion may extend below the bottom side of the first electrical component.

The lower electrical module may include a second electrical component, a second handle for carrying the second electrical component and a second protrusion. The second electrical component may be disposed below the first electrical component. The second electrical module may define opposed top and bottom sides. The second handle may be attached to the second electrical component and extend above the top side of the second electrical component. The second handle may have a second recess for receiving the first protrusion of the upper electrical module for stacking the upper electrical module on top of the lower electrical module. The second protrusion may extend below the bottom side of the second electrical module.

The first and second handles may be attached to four corner portions of the first and second electrical components with a central gripping portion for lifting the upper and lower electrical modules. The first and second handles may have at least four first and second recesses sized and configured to receive a corresponding number of first and second protrusions for providing stability when the upper electrical module is stacked upon the lower electrical module.

The first and second electrical components may be an inverter or an engine generator. It is also contemplated that the first and second electrical components may be different electrical components. By way of example and not limitation, the first electrical component may be an engine generator and the second electrical component may be an inverter, or vice versa.

The first and second protrusions may be covered with a damping material or may be fabricated from a damping material for isolating vibration caused by first and second electrical components. By way of example and not limitation, the damping material may be rubber material, elastomeric material or plastic material.

The protrusion and recess have a mating frusto conical configuration or a mating dome configuration.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 3 is a front plane view of the stacked inverter generator modules shown in FIG. 1 with a partial cross section illustrating recesses and mounts for stacking the inverter generator modules;

DETAILED DESCRIPTION

Figure 1:
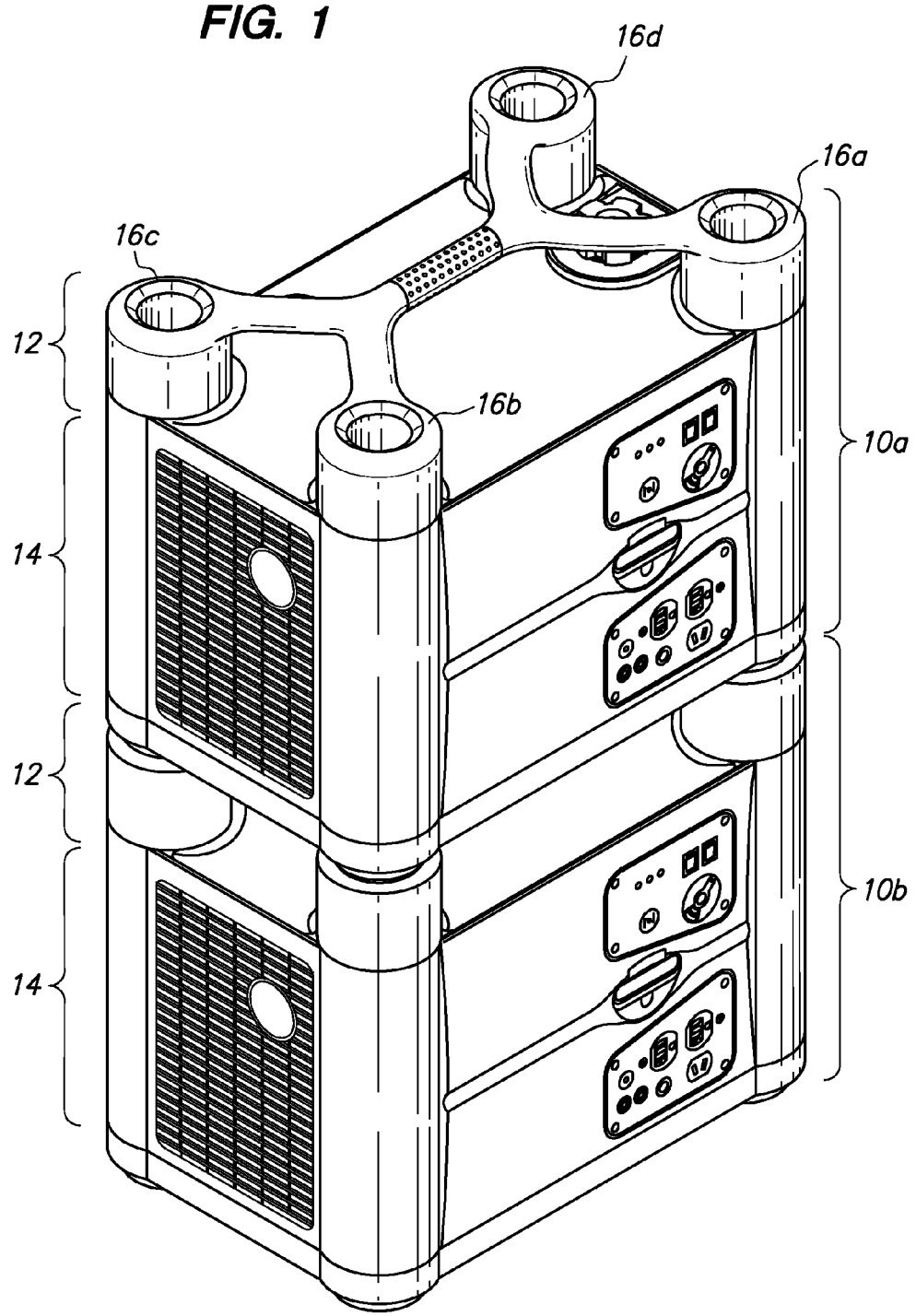
FIG. 1 is a perspective view of two stacked inverter generator modules.
Figure 2:
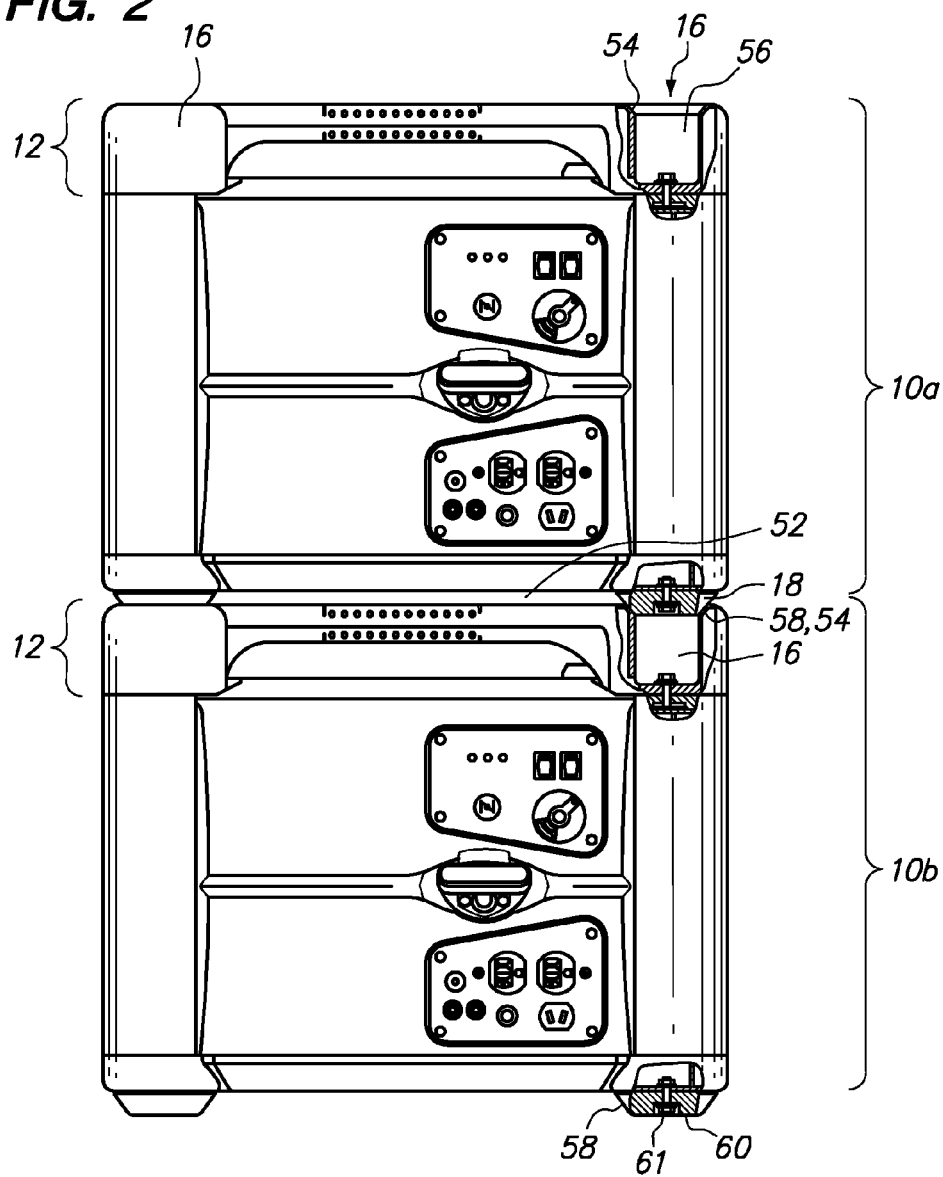
FIG. 2 is an exploded view of one of the inverter generator modules shown in FIG. 1.

Referring now to FIG. 1, stackable inverter generator modules 10a, b are shown. Each of the stackable inverter generator modules 10a, b may have a handle 12 attached to a top side of an inverter generator 14 so that a person can grasp the handle 12 and lift the upper stackable inverter generator module 10a off of a lower stackable inverter generator module 10b and/or transport the upper stackable inverter generator module 10a to a different location. After the upper stackable inverter generator module 10a is lifted off of the lower stackable inverter generator module 10b, the user may transport the lower stackable inverter generator module 10b to a different location by grasping the handle of the lower stackable inverter generator module 10b. Conversely, during setup, the user may use the handle 12 to lift an upper stackable inverter generator module 10a on top of a lower stackable inverter generator module 10b. Since the stackable inverter generator modules 10a, b are stackable, the foot print of a plurality of stacked inverter generator modules 10a, b-n is minimized to reduce the space requirement to setup the plurality of inverter generator modules 10a-n. In order to stack the inverter generator modules 10a, b-n, each of the inverter generator modules 10a-n may have recesses 16 formed in the top side of the handle 12, as shown in FIG. 2. These recesses 16 may receive mounts 18 attached to a bottom side of the upper inverter generator module 10a.

Accordingly, the stackable inverter generator modules 10a-n provide for a convenient means for carrying the inverter generator 14 (see FIG. 3) by way of the handle 12 and also a convenient means for stacking a plurality of inverter generator modules 10a-n by way of mating recesses 16 and mounts 18.

Figure 2A:
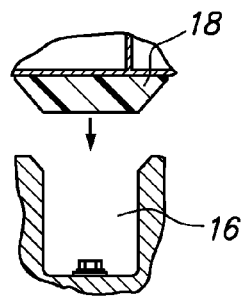
Figure 2B:
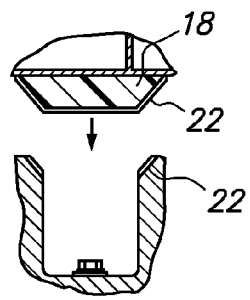

Moreover, the mounts 18 and/or the portions of the handle 12 that define the recesses 16 may be fabricated from a dampening material, as shown in FIG. 2A. Alternatively, a dampening material 22 may be coated over the mounts 18 and/or the portion of the handle 12 that defines the recesses 16, as shown in FIG. 2B. In this manner, vibration caused by the inverter generator 14 of the upper module 10a is isolated from the lower inverter generator module 10b, and vice versa.

More particularly, the stackable modules 10a, b are being described in relation to inverter generators 14. However, any type of mechanical component and/or electrical component such as an engine generator, etc. may be employed. Since the stackable modules 10a-n are capable of isolating vibration, the mechanical or electrical component may vibrate without significantly disturbing adjacent modules 10a-n. The various aspects (i.e., stackability and carryability) of the device described herein may be employed with other types of non-moving, moving, mechanical, electrical devices. Accordingly, the various aspects described herein in relation to an inverter generator are for the purposes of convenience and not limitation.

The stackable modules 10a-n may each comprise the handle 12 and the mounts 18. The handle 12 is disposed adjacent a top side of the inverter generator 14, whereas, the mounts 18 are disposed adjacent a bottom side of the inverter generator 14. As shown in the FIGS. 1-3, the handle 12 may have four recesses 16a-d. These recesses 16a-d are generally pointed in the vertical up direction so that mounts 18a-d (see FIGS. 1 and 3) attached to a bottom side of an upper inverter generator 14 can be inserted into the recesses 16a-d as the upper stackable module 10a is placed on top of the lower stackable module 10b. The recesses 16a-d and the mounts 18a-d may be positioned in relation to each other so that they are aligned when the upper and lower stackable modules 10a, b are stacked upon each other.

Each of the stackable modules 10a-n may additionally have a front cover 24, rear cover 26, left and right side covers 28, 30 and top and bottom covers 32, 34. The front, rear, left side, right side, top and bottom covers 24, 26, 28, 30, 32, 34 may enclose the inverter generator 14 and provide sound insulation to minimize noise disturbance in the local area. Each of the stackable modules 10a-n may additionally have corner covers 36a-d. The inverter generator 14 may have a plurality of controls 66, an intake (not shown) and an exhaust 70. The front cover 24, rear cover 26 and left and right side covers 28, 30 may have one or more apertures 72 which are sized and configured to receive the controls 66, intake and the exhaust 70. By way of example and not limitation, the front cover 24 may have an aperture 72a that receive the controls 66. The user may operate the inverter generator 14 by the controls 66. The left cover 28 may have an aperture 72b for receiving the exhaust air of the inverter generator 14. The exhaust 70 may be released to the environment through the left cover 28. The right side cover 30 may have a perforated aperture 72c to allow air into the inverter generator 14 by way of the intake.

The handle 12 may have a central gripping portion 38. The user may grasp the central gripping portion 38 and lift the modules 10a-n for convenient hand transport from point A to point B. The central gripping portion 38 may be ergonomically sized and configured for comfortable and efficient grasping by the user. The central gripping portion may have indentations to aid in gripping. First and second arms portions 40, 42 may extend from a first distal end portion of the central gripping portion 38 of the handle 12. Additionally, third and fourth arm portions 44, 46 may extend from an opposed distal end portion of the central gripping portion 38 of the handle 12. The arm portions 40, 42, 44, 46 may extend out to the outer periphery of the inverter generator 14 and may be mounted to any one or more of the front cover 24, rear cover 26, left side cover 28, right side cover 30, top cover 32, and corner covers 36a-d. The central gripping portion 38 may be located in the center of the inverter generator 14 or the center of the top cover 32. Alternatively, the central gripping portion 38 may be vertically aligned above the center of gravity of the inverter generator 14. As such, the central gripping portion 38 may be shifted to the front/rear or to the left/right as dictated by the center of gravity of the inverter generator 14 or the electrical component housed within the covers 24, 26, 28, 30, 32, 34 and 36a-d. By way of example and not limitation, the first, second, third and fourth arm portions 40, 42, 44, and 46 may be installed in the front cover 24 and the rear cover 26 at four places with a nut and bolt connection 48, 50 through the top cover 32. The mounts 18 may be attached to the bottom cover 34 also with a nut and bolt connection 48, 50.

Referring back to FIG. 2, the mount 18 of the upper module 10a may be received into the recess 16 of the lower module 10b. When the mount 18 is received into the recess 16, the upper module 10a may be stacked upon the lower module 10b in a stable manner. Additionally, there may be a gap 52 between the upper and lower modules 10a, b to further provide vibration, and sound insulation between the upper and lower modules 10a, b. The recess 16 may have a counter sink configuration. The recess 16 may define a beveled surface 54 and a cylindrical cavity 56. The mount 18 may have a frusto conical configuration defining a beveled surface 58 and a flat distal end surface 60. When the mount 18 is received into the recess 16, the beveled surface 58 of the mount 18 rests upon and engages the beveled surface 54 of the recess 16. However when the module 10 is rested on the ground 62, the flat distal end surface 60 contacts the ground 62 to provide stability to the module 10.

The cylindrical cavity 56 may provide the space for the nut and bolt connection 48, 50 discussed above. Additionally, the flat distal end surface 60 may have a recess 61 for providing space for the nut and bolt connection 48, 50.

The handle 12 and/or the mounts 18 may provide for vibration isolation. In particular, the handle 12 and/or the mounts 18 may be fabricated from a dampening material such as rubber material, elastomeric material, plastic, etc. In this manner, the vibration caused by the inverter generator 14 of the upper module 10a is isolated from the lower module 10b, and vice versa. Alternatively, the beveled surface 54 of the recess 16 and/or the beveled surface 58 of the mount 18 may be coated or covered with a dampening material such as rubber material, elastomeric material, plastic, etc. for the purposes of vibration isolation or dampening.

It is contemplated that the mounts 18 may be adjustable in height so that any differences in ground elevation may be accounted for to provide stability. By way of example and not limitation, the mounts 18 may be screwed onto a threaded stud. To adjust the height of the mounts 18, the mounts 18 are rotated on the threaded stud to raise or lower the mounts 18. Additionally, any abnormalities in the frame 20 may be accounted for by the adjustable mounts 18 such that the stacked modules 10a-n do not wobble when two or more modules 10a-n are stacked upon each other.

Figure 4:
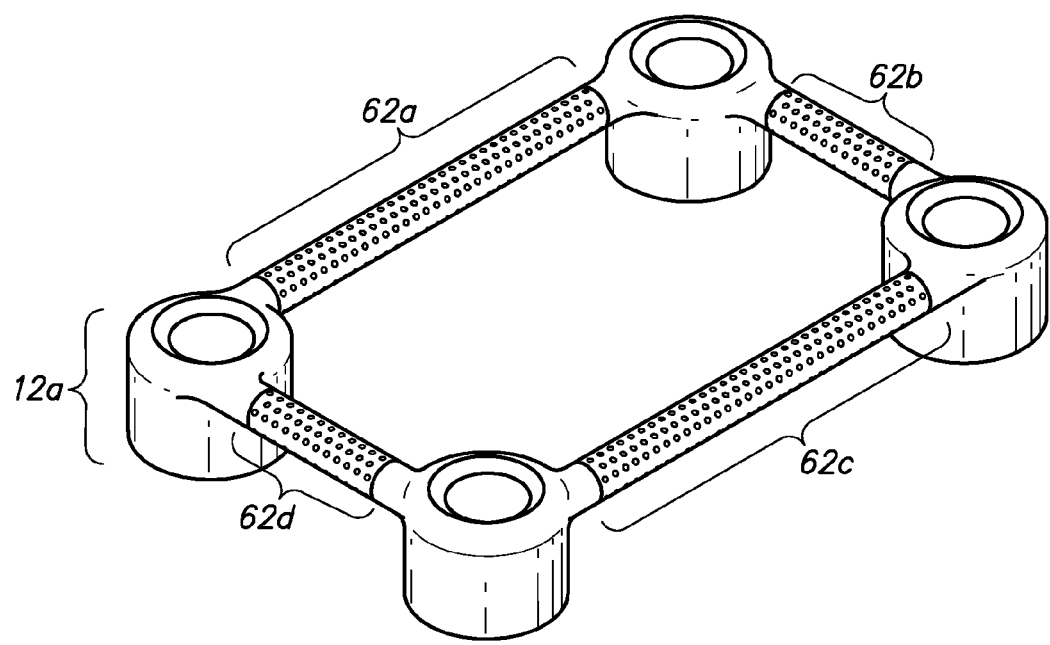
FIG. 4 is an alternate embodiment of a handle of the inverter generator modules.

Referring now to FIG. 4, an alternate embodiment of the handle 12a is shown. The handle 12a is attached to one or more of the front cover 24, rear cover 26, left side cover 28, right side cover 30, top cover 32 and corner covers 36a-d at three (3) or more places. The handle 12a may have four different gripping portions 64a-d. For heavier objects, two users may grasp opposing gripping portions 62a-c or 62b-d to lift the module 10.

During use, the inverter generator modules 10a-n may be stored in a storage room by stacking the inverter generator modules 10a-n upon each other or transported to location by way of a truck. When transporting the inverter generator modules 10a-n by truck, the inverter generator modules 10a-n may be stacked upon each other as discussed above then tied down by way of straps to prevent movement of the stacked inverter generator modules 10a-n. The interconnection between the mounts 18 and recesses 16 prevent the modules 10a-n from slipping out from one another.

To setup the inverter generator modules 10a-n at a location, the setup crew may grasp the handle 12 of an inverter generator module and place the inverter generator module at a proper location at the site. As more inverter generator modules 10 are transported, the additional inverter generator modules 10 may be stacked upon the first inverter generator 14. In particular, the mounts 18 of an upper inverter generator module 10 are inserted into recesses 16 formed in the handles 12 of a lower inverter generator module 10. As the plurality of inverter generator modules 10a-n are stacked upon each other, the exhaust 70, controls 66 and intake 68 may be oriented in the same direction. In this manner, the pull start chord of the inverter generators 14 may be located on the same side so that the plurality of inverter generator modules 10a-n may be conveniently started without having to go from side to side. Additionally, the controls 66 of the inverter generator 14 may be oriented in the same direction so that the user may conveniently control all of the stacked inverter generator modules 10 without having to go from side to side. Since the mounts 18 and/or handles 12 may be fabricated from a dampening material or may provide for dampening characteristics, pulling the start chord of one inverter generator does not significantly affect the operation of adjacent inverter generators 14. Additionally, any vibration caused by one inverter generator 14 is isolated and does not significantly affect start up and operation of adjacent stacked inverter generators 14. Accordingly, the integrated handle and stacking system provides a convenient means of transporting the inverter generator 14 from point A to point B as well as stacking a plurality of inverter generator modules 10a-n to reduce the foot print requirement when multiple inverter generators are required for setup.

Figure 5:
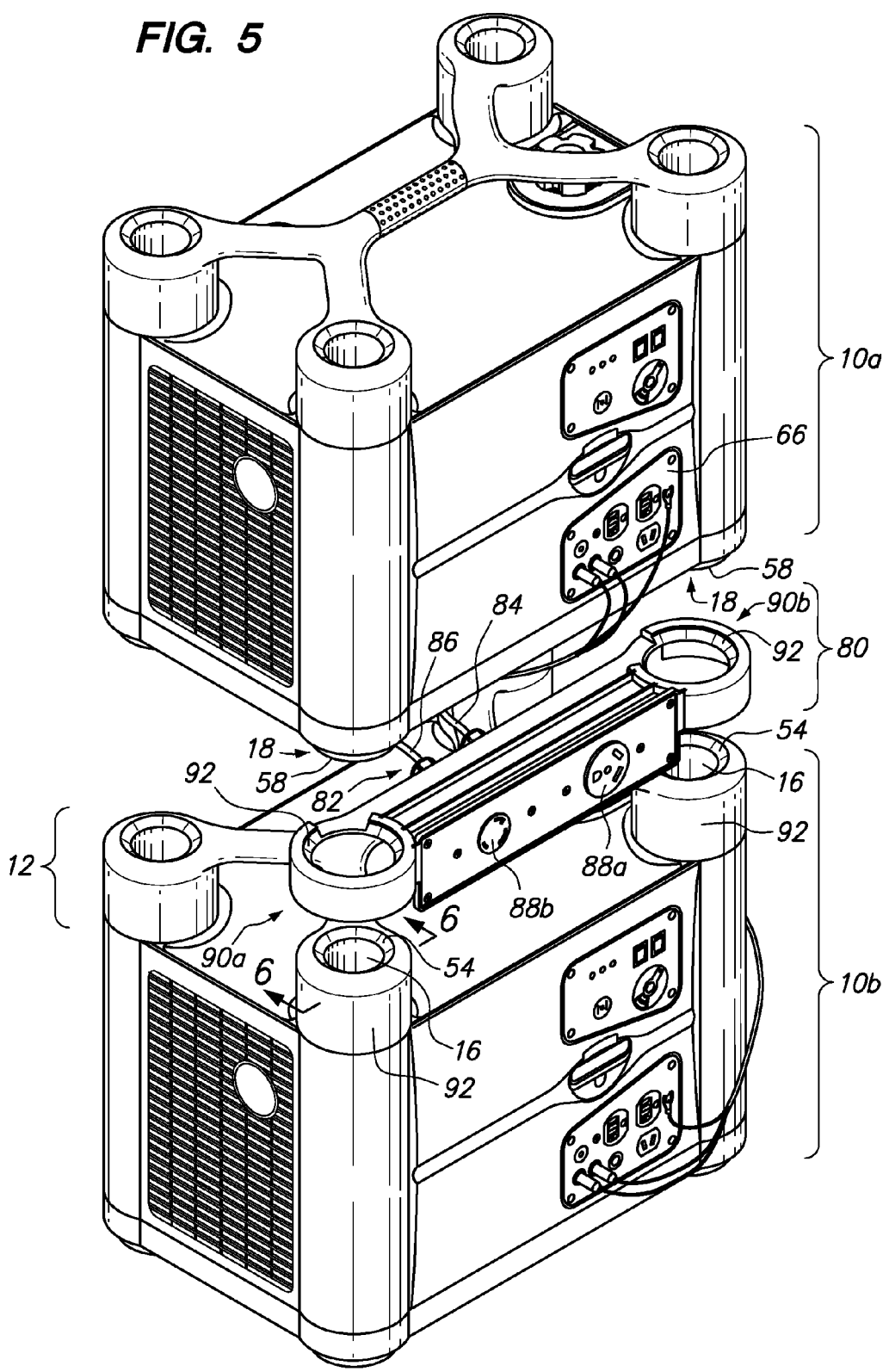
FIG. 5 is a perspective view of two stacked inverter generator modules with a parallel cable kit stackable between upper and lower inverter generator modules.

Referring now to FIG. 5, a parallel cable kit 80 is shown. The parallel cable kit 80 may have a wiring harness 82 extending from the rear side of the parallel cable kit 80. The wiring harness 82 may have a first cable 84 and a second cable 86. The first cable 84 may be routed to the upper or lower inverter generator module 10a, b. In FIG. 5, the first cable 84 is shown as being routed to the controls 66 of the upper inverter generator module 10a and electrically connected thereto. The second cable 86 may also be routed to the upper or lower inverter generator module 10a, b. In FIG. 5, the second cable 86 is shown as being electrically connected to the lower inverter generator module 10b. The wiring harness 82 and internal electrical connections of the parallel cable kit 80 allow the power of the inverter generator 10a to be combined with power of the inverter generator module 10b. The combined power is provided at outlets 88a, b.

Figure 6:
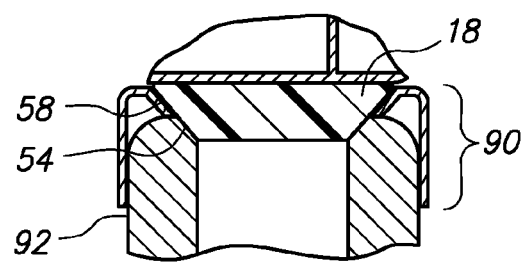
FIG. 6 is a cross sectional view of the parallel cable kit shown in FIG. 5.

To stack the parallel cable kit 80 between the upper and lower inverter generator modules 10a, b, the parallel cable kit 80 has a low profile configuration so as to be disposable between the upper and lower inverter generator modules 10a, b when stacked. The parallel cable kit 80 has distal end portions 90a, b (see FIG. 5) that mate with the recesses 16 so that the mounts 18 may be received on the distal end portions 90a, b. To this end, the distal end portions 90a, b may have a beveled surface 58 that is matched to the beveled surface 54 (see FIG. 6) of the recess 16. The distal end portions 90a, b of the parallel cable kit 80 may fit over the distal end portions 92 of the handle 12. In particular, the distal end portions 90a, b have a hollow underside so as to receive the distal end portions 92 of the handle 12.

The parallel cable kit 80 is shown as being stacked on the wide side of the inverter generator modules 10a, b. However, it is also contemplated that the parallel cable kit 80 may be shortened so that the parallel cable kit 80 may be disposed between distal end portions 92 of the handle 12 on the shorter side of the inverter generator module 10.

The above description is given by way of example, and not limitation. Given the above disclosure, one skilled in the art could devise variations that are within the scope and spirit of the invention disclosed herein, including various ways of configuring the exterior of the modules 10. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A stackable power equipment system comprising:
an upper electrical module including:
a first electrical component defining opposed top and bottom sides;
a first handle for hand carrying the first electrical component, the first handle being attached to the first electrical component, the first handle having first, second and third recesses disposed at the top side of the first electrical component, each of the recesses of the first component defining a contact surface which faces upward; and
first, second and third protrusions each protrusion disposed at the bottom side of the first electrical component, each of the protrusions defining a contact surface which faces downward;
a lower electrical module including:
a second electrical component disposed below the first electrical component, the second electrical module defining opposed top and bottom sides;
a second handle for carrying the second electrical component, the second handle being attached to the second electrical component, the second handle having fourth, fifth and sixth recesses disposed at the top side of the second electrical component for respectively receiving the first, second and third protrusions of the upper electrical module for stacking the upper electrical module on top of the lower electrical module, each of the recesses of the second component defining a contact surface which faces upward;
fourth, fifth and sixth protrusions disposed at the bottom side of the second electrical component, each protrusion of the second component defining a contact surface which faces downward.

2. The system of claim 1 wherein the first and second handles are attached to four corner portions of the first and second electrical components with a central gripping portion for lifting the upper and lower electrical modules.

3. The system of claim 1 wherein the first and second handles each include one additional recess at the top sides of the first and second electrical modules sized and configured to receive an additional protrusion extending below the bottom sides of the first and second electrical modules for providing stability when the upper electrical module is stacked upon the lower electrical module.

4. The system of claim 1 wherein the first and second electrical components are an inverter or an engine generator.

5. The system of claim 1 wherein the first and second electrical components are different electrical components.

6. The system of claim 5 wherein the first electrical component is an engine generator and the second electrical component is an inverter.

7. The system of claim 1 wherein the first and second protrusions are covered with a damping material or is fabricated from a damping material for isolating vibration caused by first and second electrical components.

8. The system of claim 7 wherein the damping material is rubber material, elastomeric material or plastic material.

9. The system of claim 1 wherein the contact surfaces of the recesses and protrusions are symmetrical about respective vertical central axes.

10. The system of claim 1 further comprising a parallel cable kit for combining the output of the upper and lower electrical modules, the parallel cable kit stacked between the upper and lower electrical modules.

11. The system of claim 10 wherein the second handle has opposed end portions and the parallel cable kit has distal end portions sized and configured to fit over the opposed end portions of the second handle.

12. The system of claim 11 wherein the distal end portions of the parallel cable kit is hollow for receiving the opposed end portions of the second handle.

13. The system of claim 11 wherein the distal end portions of the parallel cable kit have beveled surfaces that are matched to beveled surfaces of the recesses.

14. The system of claim 9 wherein the protrusions and recesses have a mating frusto conical configuration or a mating dome configuration.

15. The system of claim 1 wherein the contact surface of the recess is disposed about a vertical central axis of the recess, and the contact surface of the protrusion is disposed about a vertical central axis of the protrusion.

* * * * *